United States Patent [19]

Glennon

[11] 4,245,183
[45] Jan. 13, 1981

[54] RMS CIRCUIT FOR VOLTAGE REGULATION

[75] Inventor: Timothy F. Glennon, Rockford, Ill.

[73] Assignee: Sundstrand Corporation, Rockford, Ill.

[21] Appl. No.: 892,089

[22] Filed: Mar. 31, 1978

[51] Int. Cl.³ .......................... H02P 9/30; G06G 7/20
[52] U.S. Cl. .................................... 322/28; 324/132; 324/99 R; 328/144
[58] Field of Search ...................... 324/76, 77 R, 99 R, 324/132; 322/20, 28; 328/144

[56] References Cited

U.S. PATENT DOCUMENTS

| | | | |
|---|---|---|---|
| 2,842,740 | 7/1958 | Sparks | 324/120 |
| 3,159,787 | 12/1964 | Sexton et al. | 324/132 X |
| 3,484,705 | 12/1969 | Hanson | 324/99 X |
| 3,488,482 | 1/1970 | Ley | 324/76 X |
| 3,564,407 | 2/1971 | Metcalf et al. | 324/99 R |
| 3,755,685 | 8/1973 | Minks | 322/91 X |
| 3,922,540 | 11/1975 | Lunsford . | |
| 4,044,296 | 8/1977 | Dhyanchand et al. . | |

Primary Examiner—Robert J. Hickey
Attorney, Agent, or Firm—Wegner, Stellman, McCord, Wiles & Wood

[57] ABSTRACT

A circuit for providing a signal proportional to the RMS value of a periodic input waveform having either a variable or fixed frequency. The input waveform is applied to a rectifier. The output from the rectifier is squared and integrated at least once each period of the periodic waveform. The integrated voltage is sampled and a voltage equal to the sampled voltage is applied to a divider circuit. The output of the divider circuit is applied to a square root circuit until the integrated voltage is again sampled, at which time the voltage provided to the square root circuit is updated. The output from the square root circuit is a voltage proportional to the RMS value of the input waveform. The circuit can be coupled to an AC generator to provide RMS regulation of the AC voltage wherein the voltage proportional to the RMS value of the input waveform is applied to the exciter winding of the generator for control thereof.

16 Claims, 9 Drawing Figures

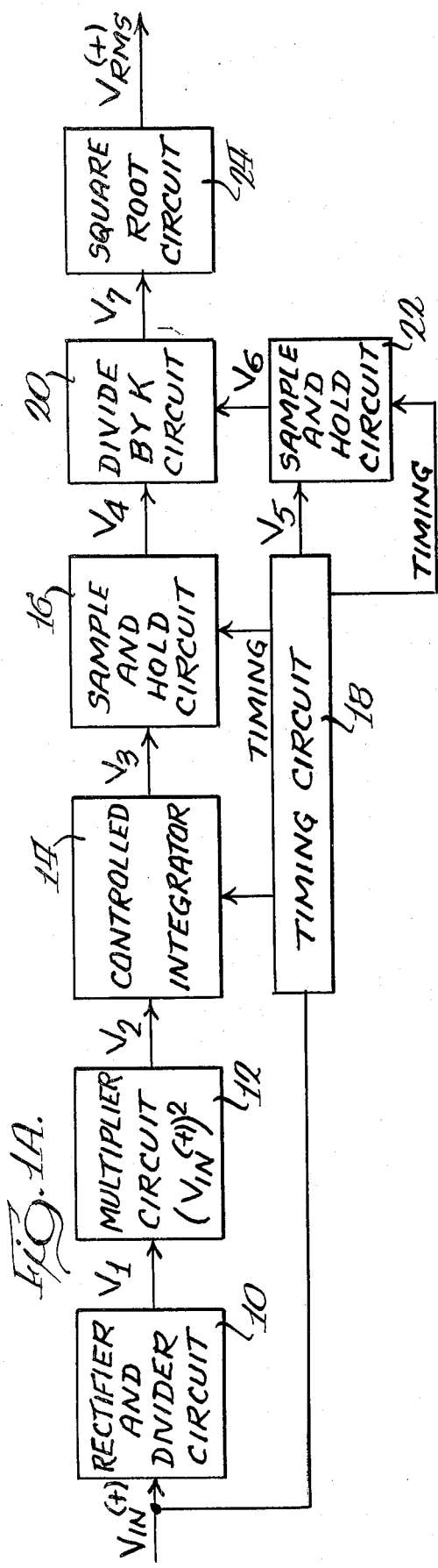
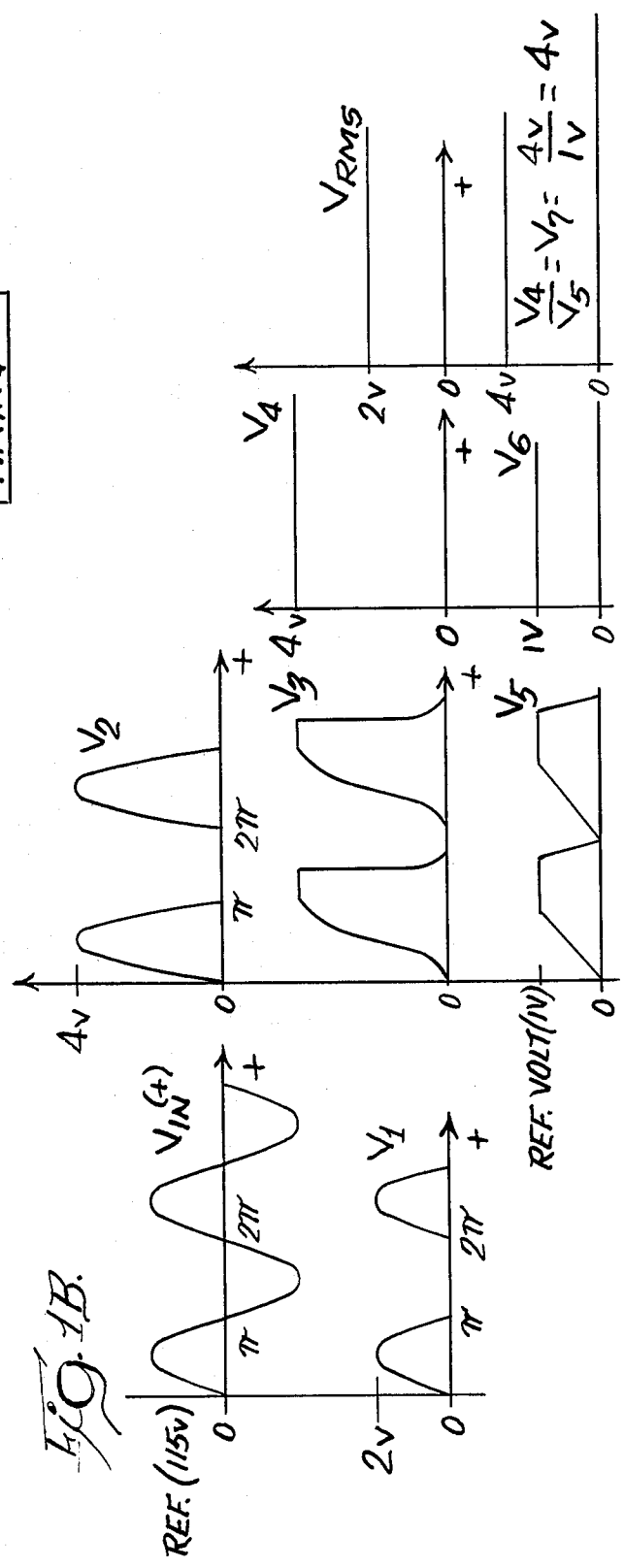

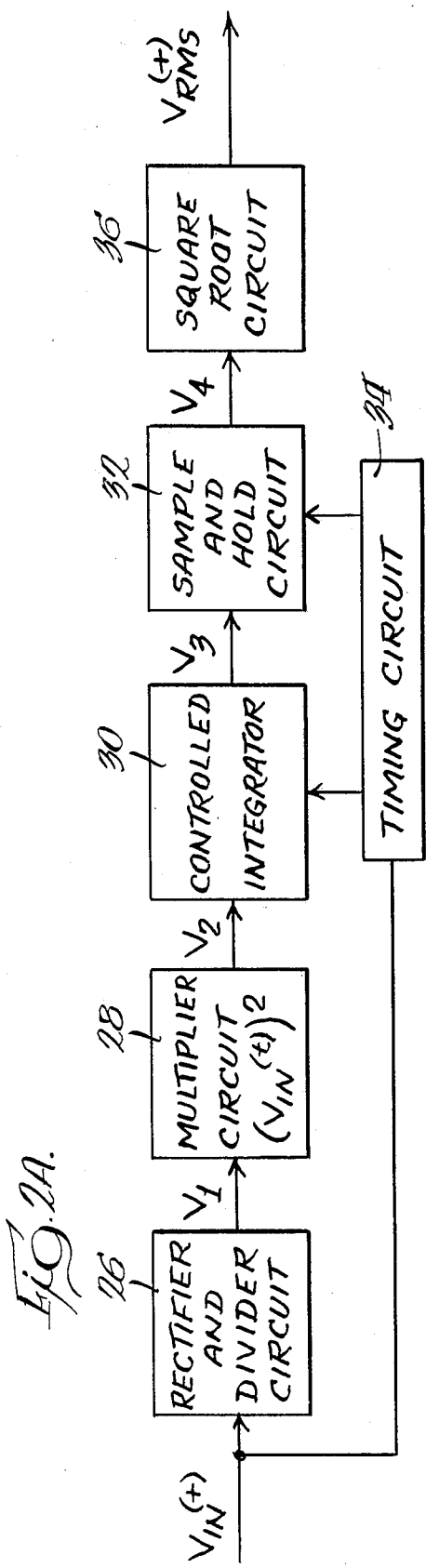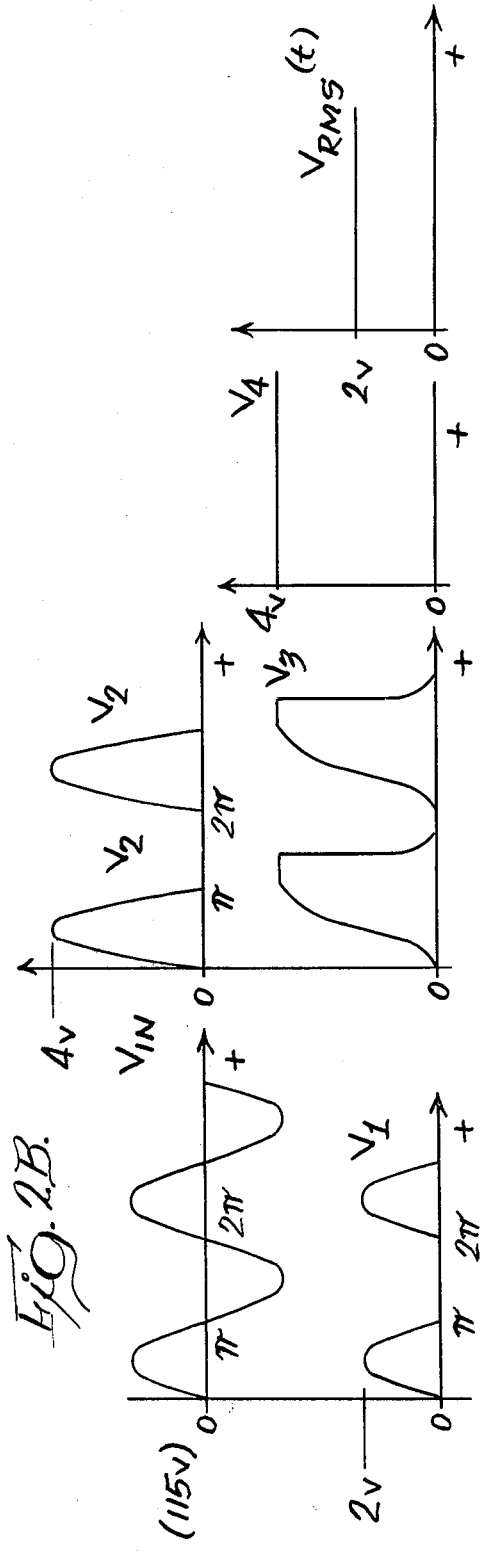

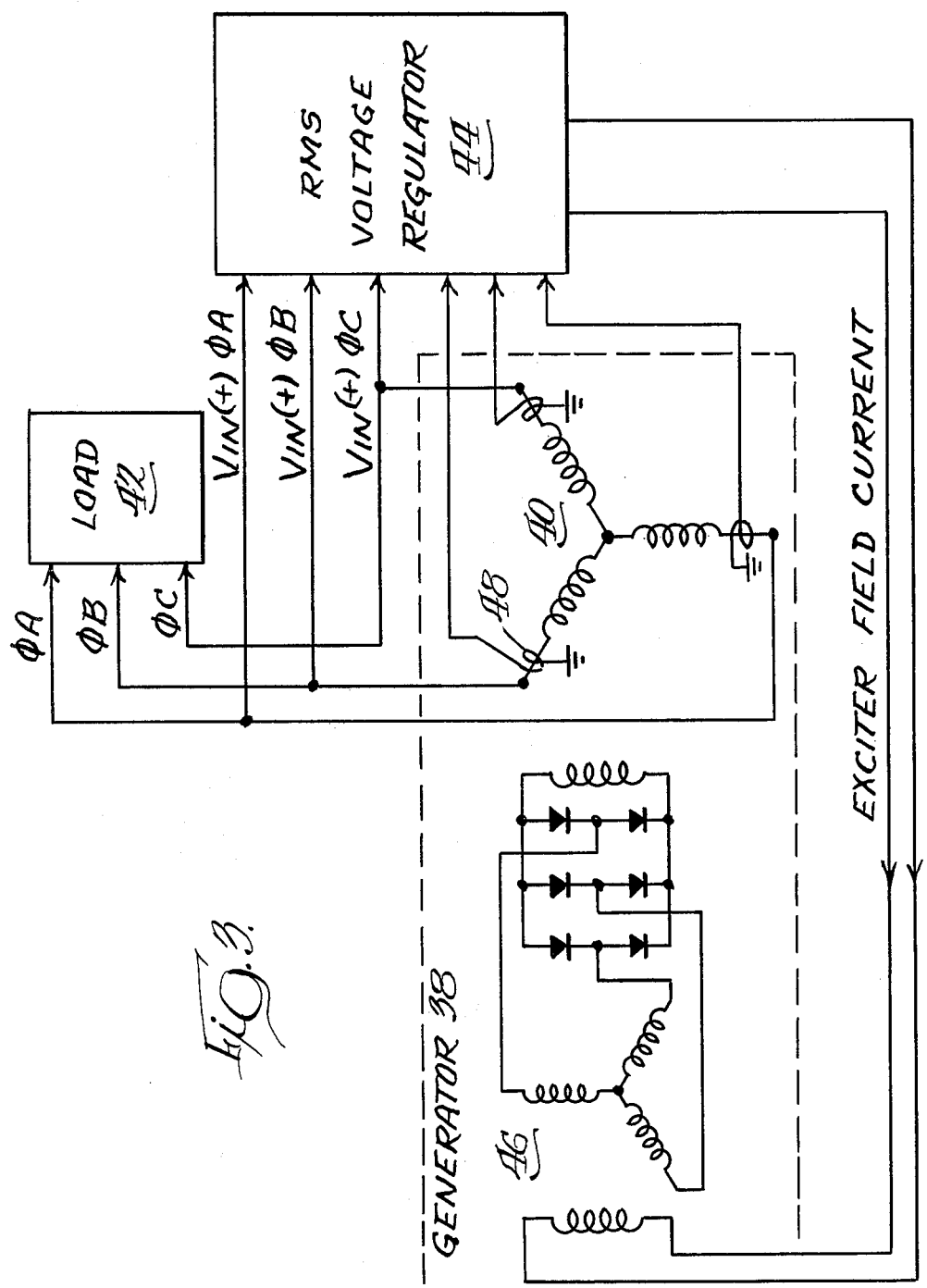

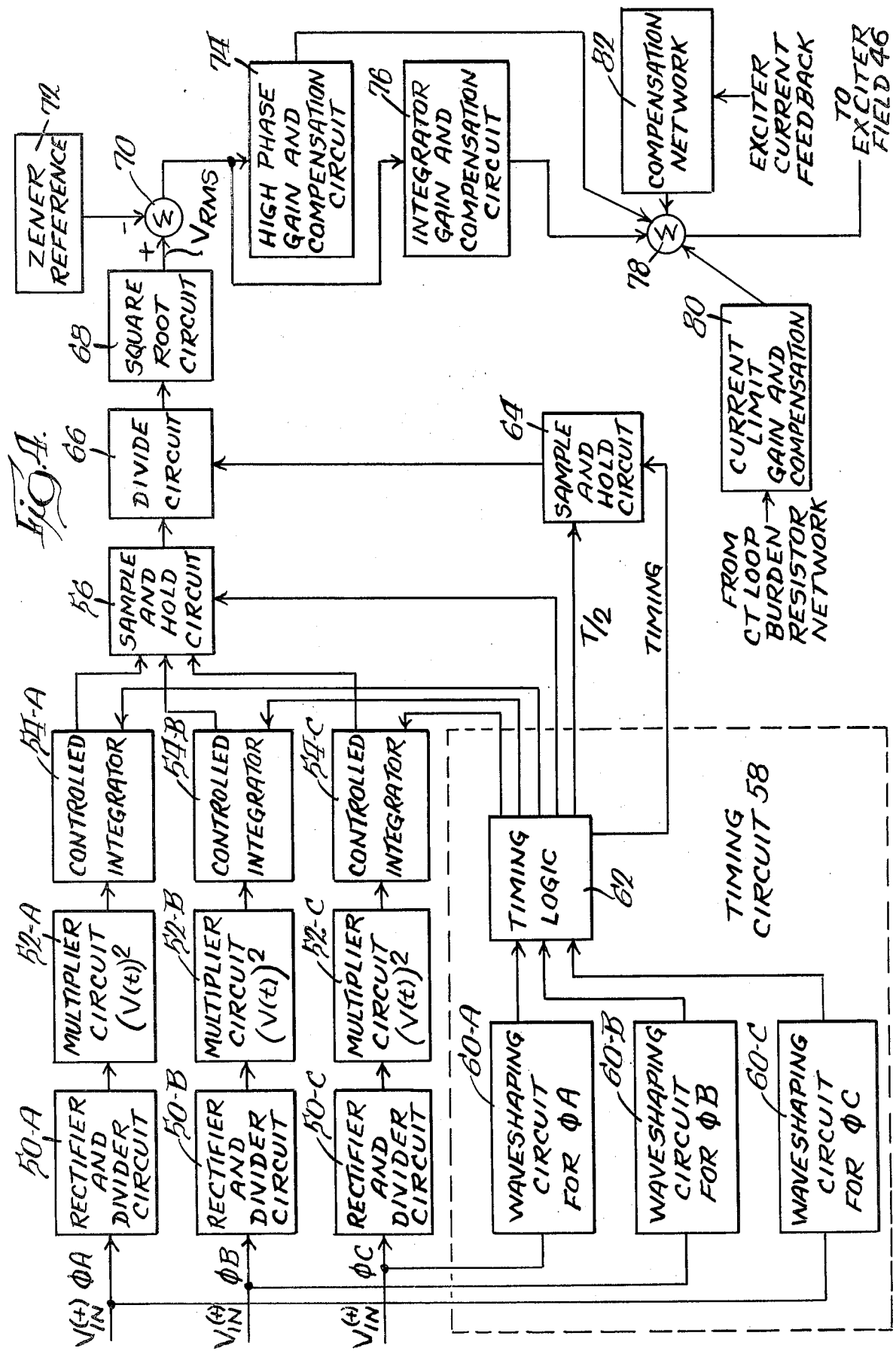

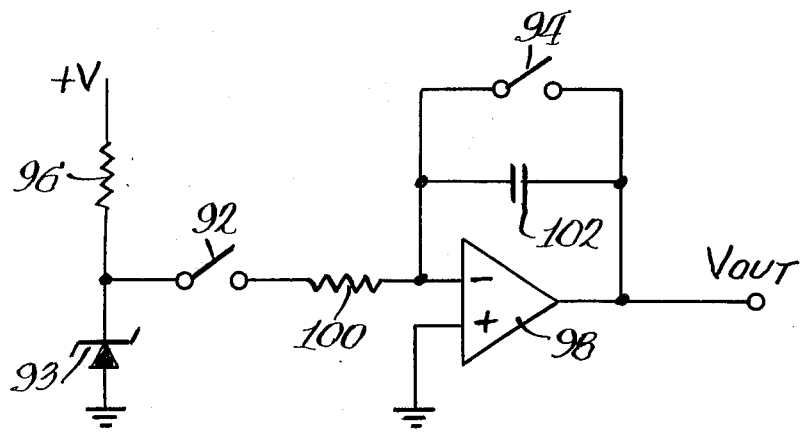
Fig. 7
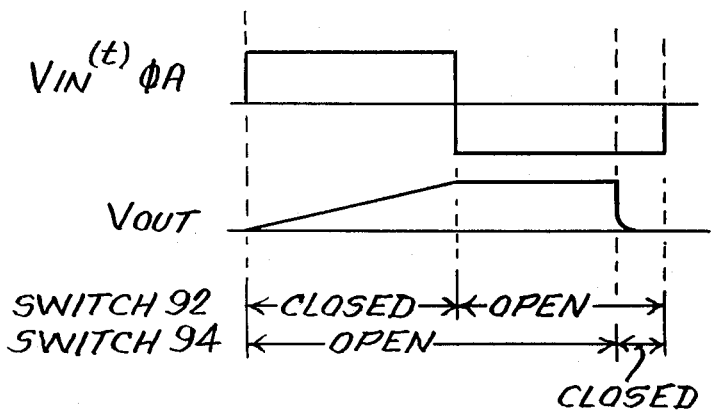

RMS CIRCUIT FOR VOLTAGE REGULATION

BACKGROUND OF THE INVENTION

This invention relates to a circuit for calculating the RMS (Root Mean Square) value of a periodic voltage and, more particularly, to a voltage regulator for a generator which utilizes the RMS value of the voltage from the generator for regulation.

Voltage regulators for aircraft generators usually employ peak or average voltage sensing for regulation. Various specifications and military requirements, however, often list performance standards of power quantity and quality in terms of RMS values. Accordingly, regulators have been developed which sense the average or peak values of the voltage and provide RMS voltage regulation from the measured average or peak values of the voltage.

These regulators may be satisfactory for generators that provide perfect sinusoidal waveforms since a fixed relationship exists between peak or average voltages and the RMS value of the voltage. However, the output voltage from the generators is not a perfect sinusoidal waveform, and the harmonic content in the output varies between generators and with loads. The harmonic content in the output destroys the fixed relationship between the peak or average voltage and the RMS voltage. Thus, regulators that sense peak or average voltage and provide RMS voltage regulation are often inaccurate.

Several attempts have been made to more accurately provide RMS voltage regulation from regulators that sense the peak or average voltage. For example, specifically designed filters and load current feedback circuits have been designed to tailor a particular generator to a voltage regulator. Since for each application the generator and regulator has unique characteristics, a filter or feedback circuit which is designed for one may not work for another as a result of variations in the harmonic content of the output voltage from the generator.

Conventional hybrid RMS to DC converters are not capable of quickly regulating the voltage in generators because they usually include a low pass filter which introduces a lag into the information conversion process that is longer than one cycle of the frequency of the generator.

SUMMARY OF THE INVENTION

In accordance with the present invention, a circuit provides the RMS value of a periodic waveform having either a variable or fixed frequency, which does not introduce a lag into the information conversion process. The circuit can be used in a voltage regulator for providing a field current proportional to the RMS value of the voltage from the generator.

The voltage from the generator is applied to a rectifier which provides for either half-wave or full-wave rectification. The output from the rectifier is applied to a multiplier for squaring the voltage from the rectifier. The squared voltage is then integrated for a period of time equal to the half-period of the waveform. At or near the end of each half period, the integrator is sampled and a voltage equal to the voltage sampled is held until the integrated voltage is again sampled. The voltage equal to the sampled voltage is divided by a voltage proportional to the half-period of the waveform. The output from the divider is applied to a circuit which takes the square root thereof to provide a continuous signal representative of the RMS value of the voltage from the generator.

The voltage regulator in accordance with the present invention is particularly well suited for a three-phase generator and provides a field current representative of the RMS value of each phase by calculating the RMS value of the voltage for each phase as discussed above and coordinating that field current with the output voltage from the generator.

It is a feature of the present invention to provide a circuit for calculating the RMS voltage of a periodic waveform having either a variable or fixed frequency.

Another feature of the present invention is to provide a circuit for calculating the RMS value of a periodic waveform for use in a voltage regulator for a generator.

Yet another feature of the present invention is to provide a circuit for calculating the RMS value of a periodic waveform which can be used in a voltage regulator for a three-phase generator.

DRAWING

FIG. 1A is a block diagram illustrating the circuit for calculating the RMS voltage from a periodic waveform having a variable frequency;

FIG. 1B depicts various waveforms at various points in the block diagram of FIG. 1A;

FIG. 2A is a block diagram illustrating the circuit for calculating the RMS voltage for a periodic waveform having a fixed frequency;

FIG. 2B depicts various waveforms at various points in the block diagram of FIG. 2A;

FIG. 3 is a block diagram of a generator employing an RMS voltage regulator in accordance with the present invention;

FIG. 4 is a block diagram of the RMS voltage regulator for the generator shown in FIG. 3;

FIG. 7 is a circuit diagram of a portion of the timing logic employed in the circuits shown in FIG. 1, 2 or 4 and the associated waveforms.

DESCRIPTION OF PREFERRED EMBODIMENT

Figure 5:
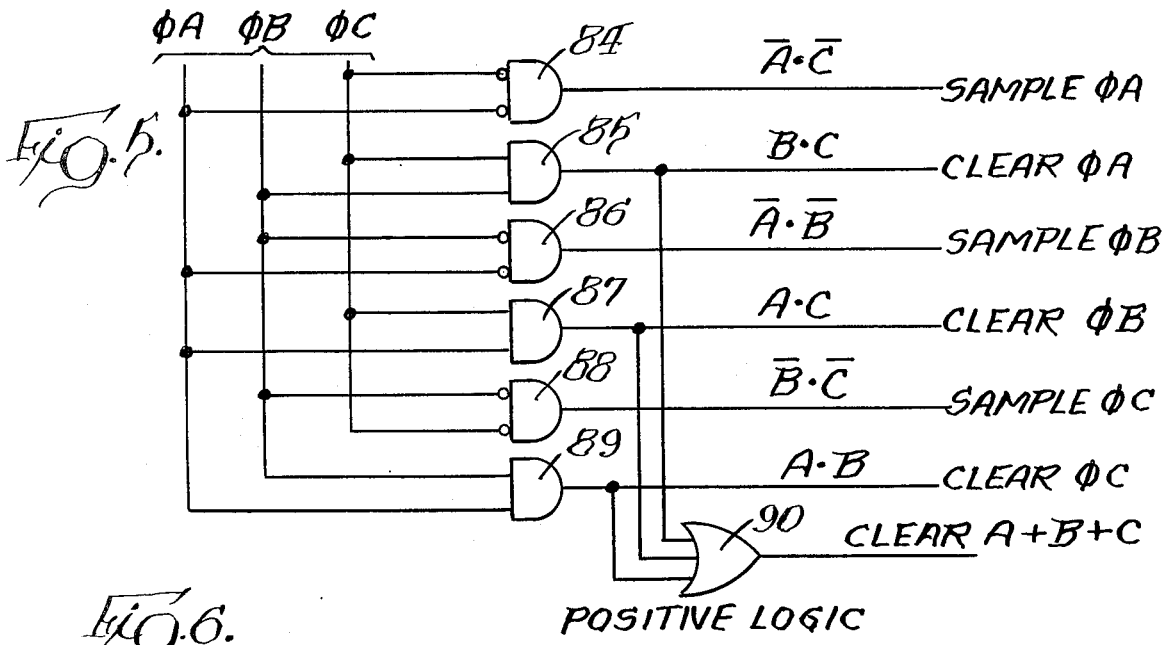
FIG. 5 is a diagram of a portion of the timing logic employed in the circuit of FIG. 4.

Referring to FIG. 1A, the circuit for calculating the root mean square voltage receives a periodic waveform $V_{IN}$, and provides a voltage $V_{RMS}$, which is the RMS value of $V_{IN}$. $V_{RMS}$ is often referred to as the effective voltage, and may be expressed as:

$$V_{RMS} = \sqrt{\frac{1}{T} \int_0^T [V_{IN}(t)]^2 dt} \quad (1)$$

wherein $V_{IN}(t)$ represents the Fourier series for any periodic input waveform of period T. Or, considering only symmetrical half-waves, Equation (1) can be rewritten as:

$$V_{RMS} = \sqrt{\frac{2}{T} \int_0^{\frac{T}{2}} [V_{IN}(t)]^2 dt} \quad (2)$$

Referring to FIG. 1B, waveforms at various points in the block diagram of FIG. 1A are shown. The waveforms shown are for a circuit that employs a half-wave rectifier, as will be discussed in detail below. A half-wave rectifier may be selected for use in the circuit when the input voltage is known to display half-wave symmetry, as is clear from Equation (2). Of course, a full-wave rectifier could be employed in lieu of a half-wave rectifier, but the waveforms in FIG. 1B would not be the same. The circuit would necessarily be changed slightly to conform to Equation (1).

Rectifier and divider circuit 10 provides for half-wave rectification of the input voltage $V_{IN}(t)$ which, for illustrative purposes is shown to have a peak of 115 volts. The output from the rectifier and divider circuit 10 is a half-wave rectified signal $V_1$ attenuated to a selected lower level, as for example a 2 V peak value. The output $V_1$ is applied to multiplier circuit 12 for squaring the input waveform to provide the $[V_{IN}(t)]^2$ term in Equation (2), which is shown as $V_2$.

The output of multiplier 12 is applied to controlled integrator 14 for integrating $[V_{IN}(t)]^2$ for each full half-period of the waveform, that is, between 0 and T/2. The output from controlled integrator 14, denoted as $V_3$, is applied to sample and hold circuit 16. After the voltage $V_3$ from controlled integrator 14 is sampled and held by sample and hold circuit 16, controlled integrator 14 is zeroed and is ready to operate on a next half-cycle of the input waveform.

The output of the sample and hold circuit 16 is a constant DC voltage which is updated to a new value each time the control integrator 14 is sampled. The output from the sample and hold circuit 16 is constant until the next update point.

Timing circuit 18, which is responsive to the input voltage $V_{IN}(t)$, controls the points in time at which the controlled integrator 14 integrates the voltage $[V_{IN}(t)]^2$ to assure that integration takes place for the full half-period of $V_{IN}(t)$, that is, between 0 and time T/2. Timing circuit 18 also coordinates the timing of the sample and hold circuit 16 so that the output from the controlled integrator 14 is sampled at the end of the period during which integration occurs. Thereafter, the controlled integrator 14 is cleared by a signal from the timing circuit 18. The details of timing circuit 18 will be discussed in greater detail below in connection with FIGS. 5 and 6.

The constantly updated DC voltage from sample and hold circuit 16, which is shown in FIGS. 1A and 1B as $V_4$, is applied to divider circuit 20. The time period T/2 is derived from the voltage $V_5$ from the timing circuit 18. This voltage is sampled by sample and hold circuit 22 to provide a voltage $V_6$. The magnitude of the voltage $V_6$ is proportional to the length of time T/2, but is constant for the half-period. The voltage from sample and hold circuit 16 is divided by the voltage from sample and hold circuit 22 to provide the division of $[V_{IN}(t)]^2$ by T/2 as required by Equation (2).

The output from divide circuit 20, as represented by $V_7$, is applied to square root circuit 24. The square root circuit 24 generates a voltage equal to the square root of the voltage applied to its input. This circuit provides the square root operation in Equation (2). The output from square root circuit 20 is $V_{RMS}(t)$, which is proportional to the RMS value of $V_{IN}(t)$, as shown.

Often there are systems in which the frequency of the voltage $V_{IN}(t)$ is controlled to remain constant. If the frequency of the voltage $V_{IN}(t)$ is constant and displays half-wave symmetry, the circuit shown in FIG. 1A can be simplified. Specifically, assuming half-wave symmetry and further assuming that the frequency of the input waveform $V_{IN}(t)$ is constant, Equation (3) can be expressed as follows:

$$V_{RMS} = \sqrt{\frac{1}{K} \int_0^{\frac{T}{2}} [V_{IN}(t)]^2 dt} \qquad (3)$$

wherein T/2 represents a fixed period of time equal to a half period of the waveform $V_{IN}(t)$, and K represents a constant proportional to the fixed period of time T/2.

Referring to FIG. 2A, the circuit for calculating the root mean square voltage of a periodic waveform displaying half-wave symmetry and displaying a fixed frequency is shown. Although a half-wave rectifier will be described in detail below, a full-wave rectifier could be employed in lieu of the half-wave rectifier. In that event, the waveforms of FIG. 2B would not be the same.

Rectifier and divider circuit 26 provide for half-wave rectification of the input voltage which, for purposes of illustration, is shown to have a peak of 115 volts. The output from the rectifier and divider circuit 26 is a half-wave rectified signal $V_1$ attenuated to a selected lower level as, for example, 2 volts peak value. The output $V_1$ is applied to multiplier circuit 28 for squaring the input waveform to provide the $[V_{IN}(t)]^2$ term of Equation (3), which is shown as $V_2$.

The output from multiplier 28 is applied to controlled integrator 30 for integrating the $[V_{IN}(t)]^2$ for each full half-period of the waveform, that is, between 0 and T/2. The output from controlled integrator 30, denoted as $V_3$, is applied to sample and hold circuit 32. After the voltage $V_3$ from controlled integrator 30 is sampled and held by sample and hold circuit 32 to provide $V_4$, controlled integrator 30 is zeroed and is ready to operate on the next half-cycle of the input waveform having the constant period.

The output of the sample and hold circuit 32, $V_4$, remains constant for the half-period, and is updated to a new value each time the controlled integrator 30 is sampled. The output from the sample and hold circuit 32 is constant until the next update point.

Timing circuit 34, which is responsive to the input voltage $V_{IN}(t)$, controls the point in time at which the controlled integrator 30 integrated the voltage $[V_{IN}(t)]^2$ to assure that integration takes place for the full half-period of the voltage $V_{IN}(t)$, that is, between 0 and T/2. Timing circuit 34 also coordinates the timing of sample and hold circuit 32 so that the output from the controlled integrator 30 is sampled at the end of the period during which integration occurs. Thereafter, controlled integrator 30 is cleared by a signal from timing circuit 34. The details of the timing circuit will be discussed in greater detail below in connection with FIGS. 5 and 6.

The constantly updated DC voltage, $V_4$, from sample and hold circuit 32, is applied to the square root circuit 36. The square root circuit 36 provides a voltage equal to the square root of the voltage applied to its input in a manner identical to that described with respect to FIG. 1A. The output from the circuit is $V_{RMS}(t)$, which is proportional to the RMS value of $V_{IN}(t)$ as shown for an input waveform having a constant frequency.

Referring to FIG. 3, a generator having a regulator employing the principles of the circuit of FIG. 1 or FIG. 2 is shown. Generator 38, schematically shown to include main windings 40, provides power at a rated AC voltage (115 volts) to load 42. RMS voltage regulator 44 receives the voltages $V_{IN}(t)$ for each phase of the voltage from windings 40. The phase voltages will hereinafter be referred to as $\phi A$, $\phi B$ and $\phi C$ voltages. As will be explained in detail below, RMS voltage regulator 44 provides a field current to maintain the RMS value of the input voltage $V_{IN}(t)$ for accurate RMS regulation of the output voltage. Also applied to RMS voltage regulator 44 are signals from current transformers 48 which represent the current provided to load 42. These signals can be employed to control the magnitude of the exciter field current during a fault condition.

Referring to FIG. 4, the RMS voltage regulator will now be described. The input voltages $V_{IN}(t)$ for each $\phi A$, $\phi B$ and $\phi C$ are applied to rectifier and divider circuit 50-A, 50-B and 50-C, respectively. Each of the rectifier and divider circuits 50 operates in an identical manner, and similar to the corresponding circuit discussed above in connection with FIG. 1. The outputs from the rectifier and divider circuits are applied to the multiplier circuits 52 for each $\phi A$, $\phi B$ and $\phi C$, and operate in a manner identical to the corresponding circuit discussed in connection with FIG. 1. The output from the multiplier circuit is applied to controlled integrator circuit 54 for each $\phi A$, $\phi B$ and $\phi C$, and also operates in a manner identical to the corresponding circuit described in connection with FIG. 1.

The outputs from controlled integrators 54 are applied to the sample and hold circuit 56 which samples voltage therefrom once each half-period for $\phi A$, $\phi B$ and $\phi C$, or three times per cycle of $V_{IN}(t)$.

The timing circuit 58, which is functionally similar to timing circuit 18 in FIG. 1, includes wave-shaping circuit 60-A, 60-B, 60-C and timing logic 62. The timing logic 62 is responsive to $V_{IN}(t)$, and controls the periods of time in which controlled integrators 54-A, 54-B and 54-C are operated and cleared and the time in which the sample from integrators 14 are sampled by sample and hold circuit 16. Timing logic 62 also provides a signal proportional to T/2 to sample and hold circuit 64.

The output from the sample and hold circuit 56 is applied to the divider circuit 66. The voltage from sample and hold circuit 56 is divided by the voltage representing T/2 as required by Equation (2). The output of divide circuit 66 is applied to square root circuit 68. The square root circuit 68 provides an output voltage $V_{RMS}(t)$ proportional to the RMS value of the input voltage for $\phi A$, $\phi B$ and $\phi C$ of the voltage $V_{IN}(t)$.

The output from square root circuit 68 is applied to a comparator 70. Also applied to comparator 70 is a voltage from zener reference 72 which represents a selected or reference RMS value for the voltage. The output from comparator 70 is an error signal representative of the difference in magnitude and sign between the measured RMS voltage from square root circuit 68 and the reference voltage from zener reference 72. The output from comparator 70 is applied to high-phase gain and compensation circuit 74 and to integrator gain and compensation circuit 76.

The high-phase gain and compensation circuit 74 is of the form $$\frac{K_1(T_1 S + 1)}{T_2 S + 1}$$

and has a selected time constant such that the highest phase will dominate. The output from high-phase gain and compensation circuit 74 provides the basic correction signal to summer 78.

The integrator gain and compensation circuit 76 is of the form $$\frac{K_2(T_3 S + 1)}{S(T_4 S + 1)},$$

and provides for integral trim yielding zero error voltage control. The voltage correction range of this circuit is limited (as to 5 volts) so the highest phase proportional signal dominates during transients. The output of integrator gain and compensation circuit 76 is applied to summer 78.

The output from summer 78 is a voltage proportional to the RMS value of the voltage $V_{IN}(t)$, and is coupled to the exciter field 46 (FIG. 2) of generator 44.

Other networks and circuits can be applied to summer 78 to further modify the signal from integrator gain and compensation circuit 76. For example, current limit gain and compensation circuit 80, coupled to the current transformer 48 (FIG. 2) may provide a signal to reduce the magnitude of the field current in the event that the per unit current becomes excessive, as during fault conditions. Also, compensation network 82, which receives a signal proportional to the exciter current, may be employed to improve transient performance and eliminate gain variations due to temperature changes in the exciter field resistance.

The field current may be pulse-width modulated and synchronized with generator 44 in any acceptable manner including synchronization of the 1200 Hz ripple frequency. Alternatively, the field current amplifier can be synchronized to the generator 44 by use of a PMG (not shown).

It is apparent that the system described above is particularly well suited for accurate regulating during a transient condition when the frequency of $V_{IN}(t)$ changes. Such transient conditions may result from many factors, including the application of a shock load (i.e., when the rated load is applied to the generator in one step). Of course, if the frequency of $V_{IN}(t)$ is assumed to be constant, the system described above can be simplified, as discussed in connection with FIG. 2.

Figure 6:
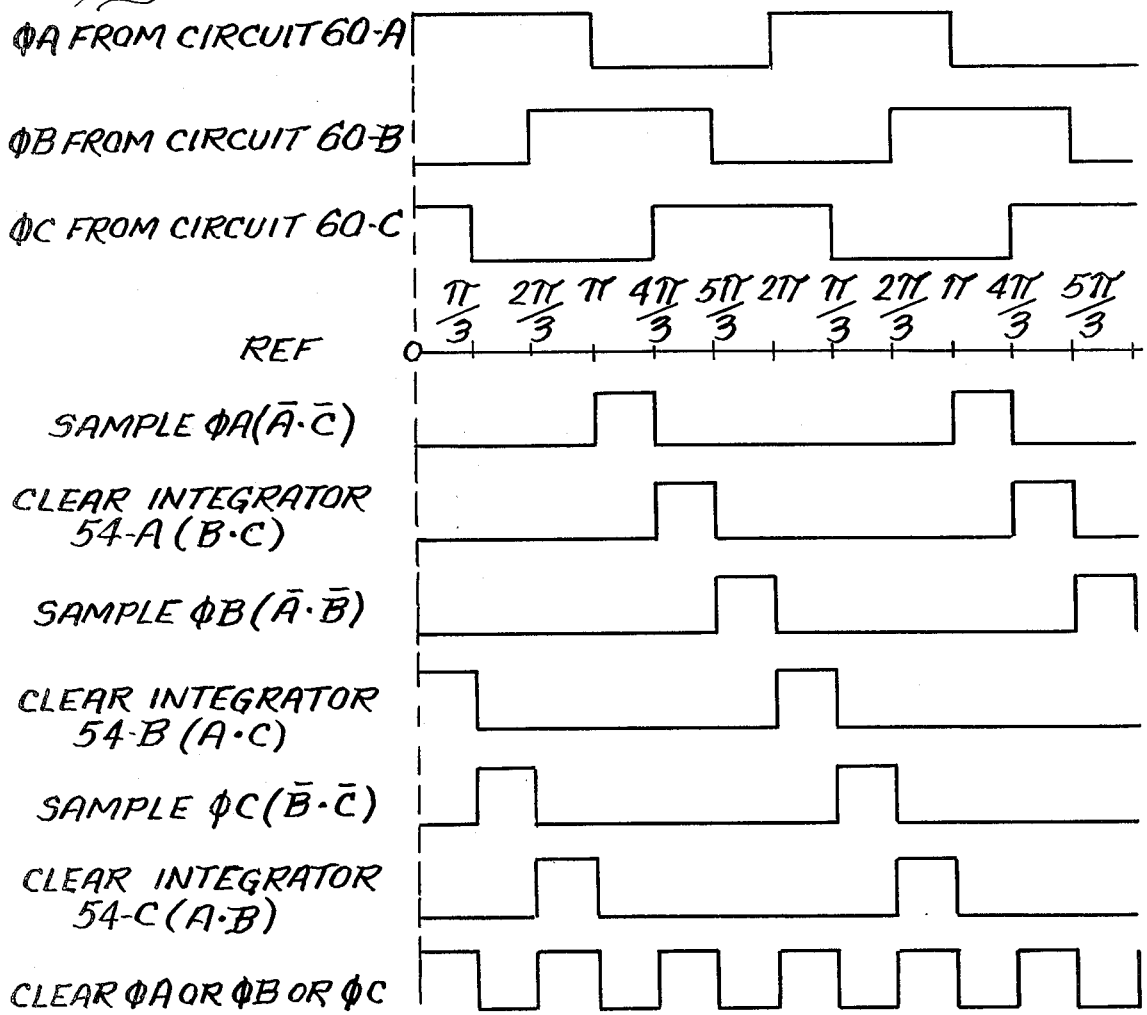
FIG. 6 depicts waveforms helpful in the understanding of the timing logic shown in FIG. 5.

The timing logic 62 includes the circuit shown in FIG. 5 and the circuit shown in FIG. 7. Referring to FIG. 5, $\phi A$, $\phi B$ and $\phi C$ of the voltage $V_{IN}(t)$ are selectively provided to gates 84–89. Gates 84, 86 and 88 are provided with inverters on their input, as shown. The outputs from gates 84–89 represent the sample and clear functions for each phase of the voltage from generator 44. Specifically, the sampling of the $\phi A$ voltage occurs at the end of the reception of the half-period from $\phi A$ ($\pi$), and is represented by $\overline{A} \cdot \overline{C}$, as seen in FIG. 6. The integrator 54-A is cleared at $4\pi/3$ after $\phi A$ has been sampled, and is represented by B·C. Each half-period, the voltage of controlled integrator 54-B is sampled by a sample $\phi B$ signal developed from $\overline{A} \cdot \overline{B}$ at $5\pi/3$. After integrator 54 has been sampled, it is cleared by a signal clear $\phi B$ signal developed from A·C at $2\pi$. Finally, integrator 54-C is sampled at the end of the half-period of φC voltage at π/3 by sample φC developed from B·C. Controlled integrator 54-C is cleared by clear φC signal which may be developed from A·B at 2π/3. OR gate 90 may be employed to provide a clear signal for φA, φB or φC.

Referring to FIG. 7, an analog circuit for providing a voltage proportional to T/2 is shown, and is typical of each circuit required for each of φA, φB and φC. The switches 92 and 94 may be controlled by the logic shown in FIG. 5 so long as they open and close in accordance with the waveform shown in FIG. 7. When switch 92 is closed, a reference voltage, established by zener diode 94 by current flow through resistor 96, is applied to the negative terminal of op-amp 98 by way of resistor 100. At the end of the $V_{IN}(t)$ for A, switch 92 is opened and the output voltage stored by capacitor 102 may be sampled. The output voltage is proportional to T/2. After the voltage has been sampled, capacitor 102 is cleared by closing switch 94.

Although an analog system has been described, many circuits could be used to provide a voltage proportional to the time T/2. It is apparent that the timing logic can perform additional functions. First, in the event of a fault which causes the voltage of one or more phases to collapse to zero, the PMG takes over the timing function. Also, the PMG (permanent magnet generator) voltage or the phase voltage can be applied to a triangular oscillator to synchronize the frequency of the modulating means so that the output pulse width-modulated waveform frequency is an even multiple of and in synchronization with the line voltage frequency. This is desirable to avoid any possibility of frequency modulation caused by two unsynchronized frequencies.

We claim:

1. A circuit for providing a voltage proportional to the RMS value of a periodic waveform having a fixed frequency comprising:
   means for rectifying said periodic waveform to provide a first voltage;
   means for squaring the first voltage to provide a second voltage;
   means for integrating said second voltage over a period of time equal to a period of said periodic waveform to provide an integrated voltage;
   means for dividing said integrated voltage by a signal proportional to the period of said periodic waveform;
   means for sampling the integrated voltage at least once each period of said periodic waveform to provide a sample voltage; and
   means for taking the square root of the sample voltage, thereby providing a voltage proportional to said RMS value of the periodic waveform.

2. A circuit for providing a voltage proportional to the RMS value of a periodic waveform having a variable frequency comprising:
   means for rectifying said periodic waveform to provide a first voltage;
   means for squaring the first voltage to provide a second voltage;
   means for integrating said second voltage over a period of time equal to one-half a period of said periodic waveform to provide an integrated voltage;
   means for dividing said integrated one-half period voltage by a signal proportional to the one-half period of said periodic waveform;
   means for sampling the integrated voltage at least once each one-half period of said periodic waveform to provide a sample voltage; and
   means for taking the square root of the sample voltage, thereby providing a voltage proportional to said RMS value of the periodic waveform.

3. A circuit for providing a voltage proportional to the RMS value of a periodic waveform having a variable frequency comprising:
   means for rectifying said periodic waveform to provide a first voltage;
   means for squaring the first voltage to provide a second voltage;
   means for integrating said second voltage for a period of time equal to one-half a period of said periodic waveform to provide an integrated voltage;
   means for dividing said integrated voltage by a signal proportional to the period of said periodic waveform;
   means for sampling the integrated voltage at least once each one-half period of said periodic waveform to provide a sample voltage;
   means for taking the square root of the sample voltage, thereby providing a voltage proportional to said RMS value of the periodic waveform; and
   means for holding said sample voltage until said means for sampling said integrated voltage next provides a sample voltage representative of a subsequent period of said periodic waveform.

4. The circuit of claim 2 wherein said rectifier is a half-wave rectifier.

5. The circuit of claim 4 wherein said means for sampling said integrated voltage provides said sample voltage once each half-period of said periodic waveform.

6. The circuit of claim 4 wherein said rectifier is a full-wave rectifier.

7. The circuit of claim 6 wherein said means for sampling said integrated voltage provides said sample voltage once each period of said periodic waveform.

8. A circuit for providing a voltage proportional to the RMS value of a periodic waveform comprising:
   a half-wave rectifier for providing a first voltage representative of every other half-period of the periodic waveform;
   a voltage divider coupled to said half-wave rectifier for providing a second voltage proportional to and less than the first voltage;
   a voltage multiplier coupled to said voltage divider for squaring the second voltage;
   integrator means coupled to said voltage multiplier and responsive to said periodic waveform for integrating the second voltage during each half-period of the periodic waveform to provide a third voltage;
   sampling means coupled to said integrator means and responsive to said periodic waveform for sampling the third voltage at substantially the end of each half-period of the periodic waveform to provide a fourth voltage;
   means responsive to said periodic waveform for holding said fourth voltage and providing a voltage equal to said fourth voltage until said sampling means provides a fourth voltage representative of a next succeeding half-period of the periodic waveform; and
   means coupled to said holding means for providing the square root of said voltage equal to said fourth voltage, thereby providing the voltage proportional to the RMS value of the periodic waveform.

9. The circuit of claim 8 further including:
means for providing a fifth voltage proportional to the length of each half-period of the periodic waveform; and
means for dividing said voltage equal to said fourth voltage by said fifth voltage to provide a sixth voltage when said sixth voltage is applied to said means for providing the square root so that said means for providing the square root provides said voltage proportional to the periodic waveform.

10. In an AC generator for providing power to a load in response to a field current, an improved voltage regulator for providing said field current, comprising:
means for sensing a voltage component $V_{IN}(t)$ of the power;
means for generating a signal $V_{RMS}$, which signal is proportional to $$\sqrt{\frac{2}{T} \int_0^{\frac{T}{2}} [V_{IN}(t)]^2 dt}$$

wherein t represents time and T/2 represents a half-period of the periodic waveform at least once each cycle of the voltage $V_{IN}(t)$;
means for generating a field current proportional to the signal $V_{RMS}$;
means for applying said field current to the AC generator; and
an integrator gain and compensation circuit coupled in parallel with said high phase gain and compensation circuit.

11. In an AC generator for providing power to a load in response to a field current, an improved voltage regulator for providing said field current, comprising:
means for sensing the voltage component $V_{IN}(t)$ of the power;
means for rectifying $V_{IN}(t)$ to provide a first voltage;
means for squaring the first voltage to provide a second voltage;
means for integrating said second voltage over a period of time equal to one-half period of such voltage $V_{IN}(t)$;
means for sampling the integrated one-half period voltage at least once each one-half period of said periodic waveform to provide a sample voltage; and
means for taking the square root of the sampled voltage, thereby providing a voltage proportional to the RMS value of $V_{IN}(t)$.

12. The AC generator of claim 11 further including:
means responsive to $V_{IN}(t)$ for causing said means for sampling the integrated voltage to sample said integrated voltage after said period of time of said voltage $V_{IN}(t)$ is completed.

13. The AC generator of claim 11 further including means for generating a field current proportional to the signal $V_{RMS}$, and means for applying said field current to the AC generator.

14. The AC generator of claim 13 wherein said means for applying the field current to the AC generator includes
a high phase gain and compensation circuit.

15. The AC generator of claim 13 wherein said generator provides $V_{IN}(t)$ at $\phi A$, $\phi B$, $\phi C$, and said voltage is proportional to said RMS value of $V_{IN}(t)$ for $\phi A$, $\phi B$ and $\phi C$.

16. The AC generator of claim 15 wherein said means for sampling the integrated voltage samples $V_{IN}(t)$ for $\phi A$, $\phi B$ and $\phi C$ once each cycle of $V_{IN}(t)$.

* * * * *

UNITED STATES PATENT AND TRADEMARK OFFICE
CERTIFICATE OF CORRECTION

PATENT NO. : 4,245,183
DATED : January 13, 1981
INVENTOR(S) : Timothy F. Glennon It is certified that error appears in the above-identified patent and that said Letters Patent is hereby corrected as shown below:

Column 8, line 31 (Claim 4, line 1) cancel "rectifier" and insert in lieu thereof -- means for rectifying said periodic waveforms --.

Column 8, line 36 (Claim 6, line 1), cancel "rectifier" and insert in lieu thereof -- means for rectifying said periodic waveform --; cancel "4" and insert therefor -- 1 --.

Column 9, line 17 (Claim 10, line 3), after "providing" cancel "said" and substitute therefor -- a --.

Column 10, line 1 (Claim 11, line 1), after "providing" insert -- electrical --; and after "power" insert -- having a periodic voltage waveform --.

Column 10, lines 25, 26 (Claim 13, lines 2, 3) cancel "the signal $V_{RMS}$" and insert in lieu thereof -- said voltage proportional to the RMS value of $V_{IN(t)}$ --;

UNITED STATES PATENT AND TRADEMARK OFFICE
CERTIFICATE OF CORRECTION

PATENT NO. : 4,245,183

DATED : January 13, 1981

INVENTOR(S) : Timothy F. Glennon

It is certified that error appears in the above-identified patent and that said Letters Patent is hereby corrected as shown below:

Column 10, line 33 (Claim 15, line 2) "and" should be deleted and after "said voltage" -- proportional to RMS value of $V_{IN}(t)$ should be inserted.

Signed and Sealed this

Seventeenth Day of January 1984

[SEAL]

Attest:

GERALD J. MOSSINGHOFF

Attesting Officer

Commissioner of Patents and Trademarks